US009129938B1

(12) United States Patent
Cheng et al.

(10) Patent No.: US 9,129,938 B1
(45) Date of Patent: Sep. 8, 2015

(54) METHODS OF FORMING GERMANIUM-CONTAINING AND/OR III-V NANOWIRE GATE-ALL-AROUND TRANSISTORS

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/195,359

(22) Filed: Mar. 3, 2014

(51) Int. Cl.
*H01L 21/336* (2006.01)
*H01L 29/423* (2006.01)
*H01L 21/02* (2006.01)
*H01L 21/306* (2006.01)
*H01L 21/308* (2006.01)
*H01L 29/26* (2006.01)
*H01L 29/06* (2006.01)

(52) U.S. Cl.
CPC ...... *H01L 29/42392* (2013.01); *H01L 21/0262* (2013.01); *H01L 21/02631* (2013.01); *H01L 21/308* (2013.01); *H01L 21/30612* (2013.01); *H01L 29/0669* (2013.01); *H01L 29/26* (2013.01)

(58) Field of Classification Search
CPC ................................. H01L 29/42392
USPC .......................................................... 438/197
See application file for complete search history.

(56) References Cited

U.S. PATENT DOCUMENTS

| 7,208,094 | B2 | 4/2007 | Islam et al. |
| 7,534,675 | B2 | 5/2009 | Bangsaruntip et al. |
| 7,727,830 | B2 | 6/2010 | Jin et al. |
| 7,795,677 | B2 | 9/2010 | Bangsaruntip et al. |
| 7,821,061 | B2 | 10/2010 | Jin et al. |
| 7,977,755 | B2 | 7/2011 | Lin et al. |
| 8,110,458 | B2 | 2/2012 | Jin et al. |
| 8,344,425 | B2 | 1/2013 | Radosavljevic et al. |
| 2011/0049568 | A1 | 3/2011 | Lochtefeld et al. |

OTHER PUBLICATIONS

Thomas, P.M., et al., "Germanium on Nothing for Nanowire Devices", ECS Transactions, Oct. 2010, vol. 33, Issue 6, pp. 425-430.
(Continued)

*Primary Examiner* — Anthony Ho
(74) *Attorney, Agent, or Firm* — Scully, Scott, Murphy & Presser, P.C.; Louis J. Percello, Esq.

(57) ABSTRACT

Methods of forming gate-all-around transistors which include a germanium-containing nanowire and/or an III-V compound semiconductor nanowire. Each method includes the growth of a germanium-containing material or an III-V compound semiconductor material that includes an upper portion and a lower portion within a nano-trench and on an exposed surface of a semiconductor layer. In some instances, the upper portion of the grown semiconductor material is used as the semiconductor nanowire. In other instances, the upper portion is removed and then a semiconductor etch stop layer and a nanowire template semiconductor material of a Ge-containing material or an III-V compound semiconductor material can be formed atop the lower portion. Upon subsequent processing, each nanowire template semiconductor material provides a semiconductor nanowire.

20 Claims, 11 Drawing Sheets

(56) References Cited

OTHER PUBLICATIONS

Peng, J.W., et al., "Germanium Nanowire Metal—Oxide—Semiconductor Field-Effect Transistor Fabricated by Complementary-Metal—Oxide—Semiconductor-Compatible Process", IEEE Transactions on Electron Devices, Jan. 2011, vol. 58, No. 1.

Feng, J., et al., "High-Performance Gate-All-Around GeOl p-MOSFETs Fabricated by Rapid Melt Growth Using Plasma Nitridation and ALD Al2O3 Gate Dielectric and Self-Aligned NiGe Contacts", IEEE Electron Device Letters, Jul. 2008, vol. 29, No. 7.

METHODS OF FORMING GERMANIUM-CONTAINING AND/OR III-V NANOWIRE GATE-ALL-AROUND TRANSISTORS

BACKGROUND

The present application relates to methods of forming a semiconductor device, and more particularly to methods of forming gate-all-around transistors which include at least one germanium-containing nanowire and/or at least one III-V compound semiconductor nanowire.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Gate-all-around semiconductor nanowire transistors are a candidate for future complementary metal oxide semiconductor (CMOS) generations due to the excellent electrostatics and immunity to short channel effects. High-mobility semiconductor materials such as germanium (both high hole and electron mobility) and III-V compound semiconductor materials (mostly high electron mobility, but some high hole mobility) are needed for high performance CMOS devices. Thus, combining a gate-all-around semiconductor nanowire transistor architecture and germanium and/or III-V compound semiconductor materials are beneficial for both ultimate scalability and high performance.

SUMMARY

The present application provides methods of forming gate-all-around transistors which include at least one germanium-containing nanowire and/or at least one III-V compound semiconductor nanowire. Each method includes the growth of a germanium-containing material or an III-V compound semiconductor material that includes an upper portion and a lower portion within a nano-trench and on an exposed surface of a semiconductor layer. In some instances, the upper portion of the grown semiconductor material is used as the semiconductor nanowire. In other instances, the upper portion is removed and then a semiconductor etch stop layer and a nanowire template semiconductor material of a Ge-containing material or an III-V compound semiconductor material can be formed atop the lower portion. Upon subsequent processing, each nanowire template semiconductor material provides a semiconductor nanowire. In both instances, the semiconductor nanowires are anchored to a remaining semiconductor material portion and are suspended above a surface of an insulator layer.

In one aspect of the present application, the method includes providing a bilayered hard mask stack structure on an uppermost surface of a semiconductor layer, wherein the bilayered hard mask stack structure includes at least one nano-trench which extends to a portion of the uppermost surface of the semiconductor layer. Next, a semiconductor material is epitaxially grown within the at least one nano-trench and on the portion of the uppermost surface of the semiconductor layer, wherein the semiconductor material comprises a different semiconductor than the semiconductor layer and has a lower portion of a first defect density and an upper portion having a second defect density that is less than the first defect density. After epitaxially growing the semiconductor material, a bottommost layer of the bilayered hard mask stack structure is removed to expose the lower portion of the semiconductor material and the semiconductor layer. The lower portion of the semiconductor material and the semiconductor layer are then etched. The etching of the semiconductor layer exposes an insulator layer that is located beneath the semiconductor layer. Next, an uppermost layer of the bilayered hard mask stack structure is removed to expose the upper portion of the semiconductor material. A gate structure is then formed surrounding the upper portion of the semiconductor material.

In another aspect of the present application, the method includes providing a bilayered hard mask stack structure on an uppermost surface of a semiconductor layer, wherein the bilayered hard mask stack structure includes at least one nano-trench which extends to a portion of the uppermost surface of the semiconductor layer. Next, a semiconductor material is epitaxially grown within the at least one nano-trench and on the portion of the uppermost surface of the semiconductor layer, wherein the semiconductor material comprises a different semiconductor than the semiconductor layer and has a lower portion of a first defect density and an upper portion having a second defect density that is less than the first defect density. After epitaxially growing the semiconductor material, the upper portion of the semiconductor material is removed to provide a recessed semiconductor material within the at least one nano-trench. Next, an etch stop layer, and a semiconductor nanowire template material are formed on the recessed semiconductor material, wherein the semiconductor nanowire template material has an uppermost surface that is coplanar with an uppermost surface of the bilayered hard mask stack structure. A bottommost layer of the bilayered hard mask stack structure is then removed to expose the lower portion of the semiconductor material. Next, the lower portion of the semiconductor material and the semiconductor layer are etched, wherein the etching of the semiconductor layer exposes an insulator layer that is located beneath the semiconductor layer and the etching of the lower portion of the semiconductor material exposes a bottommost surface of the etch stop layer. The etch stop layer and an uppermost layer of the bilayered hard mask stack structure are then removed to expose the semiconductor nanowire template material, and thereafter a gate structure is formed surrounding the semiconductor nanowire template material.

DETAILED DESCRIPTION

Figure 1:
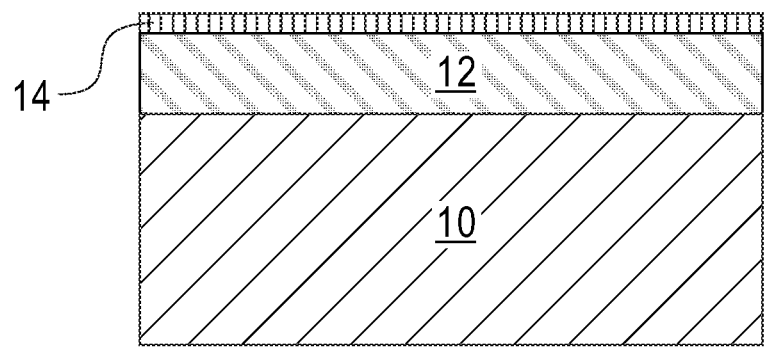
FIG. 1 is a cross sectional view of a first exemplary semiconductor structure including, from bottom to top, a handle substrate, a buried insulator layer and a semiconductor layer that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a first exemplary semiconductor structure including, from bottom to top, a handle substrate 10, a buried insulator layer 12 and a semiconductor layer 14 that can be employed in one embodiment of the present application. Specifically, FIG. 1 illustrates a semiconductor-on-insulator substrate (SOI) in which the buried insulator layer 12 is located on an upper surface of the handle substrate 10, and the semiconductor layer 14 is located on an uppermost surface of the buried insulator layer 12. The handle substrate 10 provides mechanical support for the buried insulator layer 12 and the semiconductor layer 14.

The handle substrate 10 and the semiconductor layer 14 of the SOI substrate may comprise the same, or different, semiconductor material. The term "semiconductor" as used herein in connection with the semiconductor material of the handle substrate 10 and the semiconductor layer 14 denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate 10 and the semiconductor layer 14. In one embodiment, the handle substrate 10 and the semiconductor layer 14 are both comprised of silicon. In some embodiments, the handle substrate 10 is a non-semiconductor material including, for example, a dielectric material and/or a conductive material. In yet other embodiments, the handle substrate 10 can be omitted and a substrate including the buried insulator layer 12 and the semiconductor layer 14 can be used.

In some embodiments, and when both the handle substrate 10 and the semiconductor layer 14 comprise a semiconductor material, the handle substrate 10 and the semiconductor layer 14 may have the same or different crystal orientation. For example, the crystal orientation of the handle substrate 10 and/or the semiconductor layer 14 may be {100}, {110}, or {111}. Other crystallographic orientations besides those specifically mentioned can also be used in the present application. The handle substrate 10 and/or the semiconductor layer 14 may be a single crystalline semiconductor material, a polycrystalline material, or an amorphous material. Typically, at least the semiconductor layer 14 is a single crystalline semiconductor material. In some embodiments, the semiconductor layer 14 that is located atop the buried insulator layer 12 can be processed to include semiconductor regions having different crystal orientations.

The buried insulator layer 12 of the structure shown in FIG. 1 may be a crystalline or non-crystalline oxide or nitride. In one embodiment, the buried insulator layer 12 is an oxide such as, for example, silicon dioxide. The buried insulator layer 12 may be continuous or it may be discontinuous. When a discontinuous buried insulator region is present, the insulator region exists as an isolated island that is surrounded by semiconductor material.

The structure, i.e., SOI substrate, shown in FIG. 1 may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer 14 to a layer having a thickness that is more desirable.

In one example, the thickness of the semiconductor layer 14 of the SOI substrate can be from 100 Å to 1000 Å. In another example, the thickness of the semiconductor layer 14 of the SOI substrate can be from 500 Å to 700 Å. In some embodiments, and when an ETSOI (extremely thin semiconductor-on-insulator) substrate is employed, the semiconductor layer 14 of the ETSOI substrate has a thickness of less than 100 Å. If the thickness of the semiconductor layer 14 is not within one of the above mentioned ranges, a thinning step such as, for example, planarization or etching can be used to reduce the thickness of the semiconductor layer 14 to a value within one of the ranges mentioned above. The buried insulator layer 12 of the SOI substrate typically has a thickness from 10 Å to 2000 Å, with a thickness from 1000 Å to 1500 Å being more typical. The thickness of the handle substrate 10 of the SOI substrate is inconsequential to the present application.

Figure 2:
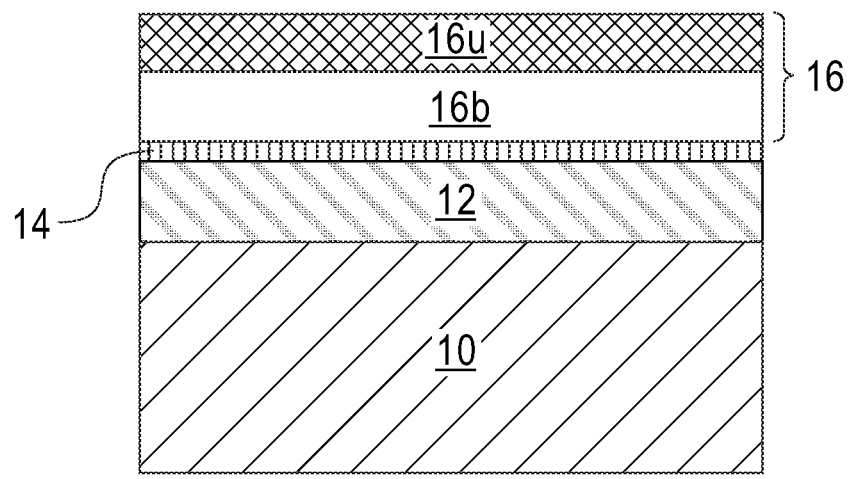
FIG. 2 is a cross sectional view of the first exemplary semiconductor structure shown in FIG. 1 after forming a bilayered hard mask stack on an uppermost surface of the semiconductor layer.

Referring now to FIG. 2, there is illustrated the first exemplary semiconductor structure shown in FIG. 1 after forming a bilayered hard mask stack 16 on an uppermost surface of the semiconductor layer 14. As is shown, the bilayered hard mask stack 16 includes a bottommost layer 16b and an uppermost layer 16u. The uppermost layer 16u of the bilayered hard mask stack 16 is in direct physical contact with a surface of the bottommost layer 16b of the bilayered hard mask stack 16, and the bottommost layer 16b of the bilayered hard mask stack is in direct physical contact with an uppermost surface of the semiconductor layer 14.

The bottommost layer 16b of the bilayered hard mask stack 16 comprises a first hard mask material and the uppermost layer 16u of the bilayered hard mask stack 16 comprises a second hard mask material that is different, in terms of etch rate, from the first hard mask material. Exemplary first and second hard mask materials that can be used in providing the bottommost layer 16b of the bilayered hard mask stack 16 and the uppermost layer 16u of the bilayered hard mask stack 16 include a semiconductor oxide, a semiconductor nitride or a semiconductor oxynitride. In one example, the bottommost layer 16b of the bilayered hard mask stack 16 can be comprised of silicon dioxide and the uppermost layer 16u of the bilayered hard mask stack 16 can be comprised of silicon nitride. In another example, the bottommost layer 16b of the bilayered hard mask stack 16 can be comprised of silicon nitride and the uppermost layer 16u of the bilayered hard mask stack 16 can be comprised of silicon dioxide.

In some embodiments of the present application, the bottommost layer 16b of the bilayered hard mask stack 16 and the uppermost layer 16u of the bilayered hard mask stack 16 may be formed utilizing a same process. In another embodiment of the present application, the bottommost layer 16b of the bilayered hard mask stack 16 and the uppermost layer 16u of the bilayered hard mask stack 16 may be formed by different processes. Exemplary processes that can be used in forming the bottommost layer 16b of the bilayered hard mask stack 16 and the uppermost layer 16u of the bilayered hard mask stack 16 include a deposition process, a thermal process or any combination thereof. Examples of deposition processes that can be used in forming the bottommost layer 16b of the bilayered hard mask stack 16 and/or the uppermost layer 16u of the bilayered hard mask stack 16 include, but are not limited to, chemical vapor deposition (CVD) and plasma enhanced chemical vapor deposition (PECVD). Examples of thermal processes that can be used in forming the bottommost layer 16b of the bilayered hard mask stack 16 and/or the uppermost layer 16u of the bilayered hard mask stack 16 include thermal oxidation and/or thermal nitridation.

The thickness the uppermost layer 16u of the bilayered hard mask stack 16 can range from 2 nm to 30 nm, with a thickness from 4 nm to 10 nm being more typical. The thickness of the bottommost layer 16b of the bilayered hard mask stack 16 is greater than the thickness of the uppermost layer 16u of the bilayered hard mask stack 16. In one embodiment, the thickness of the bottommost layer 16b of the bilayered hard mask stack 16 is from 20 nm to 150 nm, with a thickness from 30 nm to 80 nm being more typically. Other thickness ranges that are lesser than or greater than the thickness ranges mentioned herein can also be used in the present application in providing the bottommost layer 16b of the bilayered hard mask stack 16 and the uppermost layer 16u of the bilayered hard mask stack 16.

Figure 3:
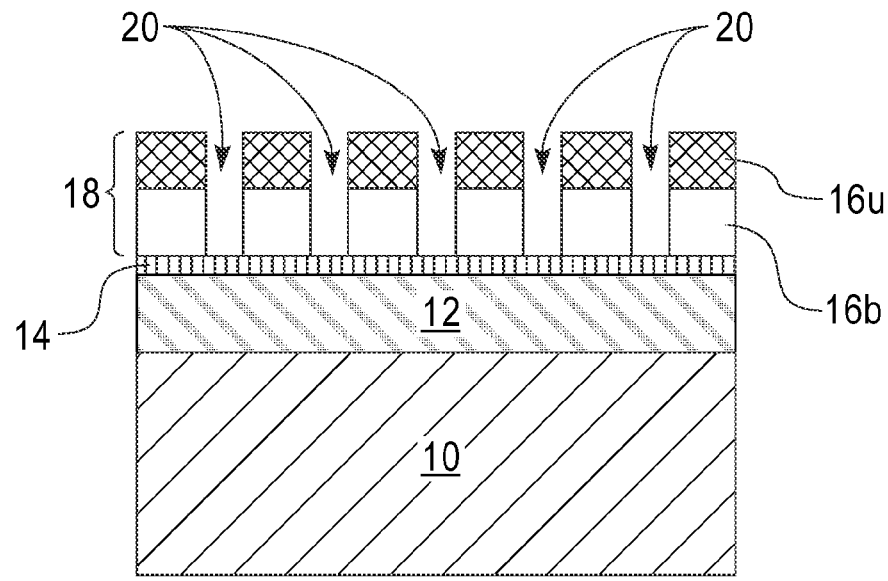
FIG. 3 is a cross sectional view of the first exemplary semiconductor structure of FIG. 2 after patterning the bilayered hard mask stack to form a bilayered hard mask stack structure that includes a plurality of nano-trenches formed therein.

Referring now to FIG. 3, there is illustrated the first exemplary semiconductor structure of FIG. 2 after patterning the bilayered hard mask stack 16 to form a bilayered hard mask stack structure 18 that includes a plurality of nano-trenches 20 formed therein. The bilayered hard mask stack structure 18 includes remaining portions of the bilayered hard mask stack 16. Notably, the bilayered hard mask stack structure 18 includes remaining portions of the bottommost layer 16b of the bilayered hard mask stack 16 and remaining portions of the uppermost layer 16u of the bilayered hard mask stack 16. Although a plurality of nano-trenches 20 are described and illustrated as being provided within the bilayered hard mask stack 16, the present application can be used when only a single nano-trench 20 is provided.

As is shown, each nano-trench 20 that is formed exposes a portion of an uppermost surface of the semiconductor layer 14. Each nano-trench 20 that is formed has a width, as measured from one sidewall of the nano-trench to another sidewall of the same nano-trench, of from 4 nm to 20 nm. Other widths that are greater than or lesser than the aforementioned range can also be employed in the present application.

The patterning of the bilayered hard mask stack 16 to form the bilayered hard mask stack structure 18 that includes the plurality of nano-trenches 20 can include lithography and etching. Lithography can include forming a photoresist material (not shown) on the uppermost surface of the bilayered hard mask stack 16, exposing the photoresist to a desired pattern of radiation and developing the photoresist utilizing a resist developer. The etching that is used to transfer the pattern from the now patterned photoresist may include dry etching (i.e., reactive ion etching, plasma etching, ion beam etching or laser ablation) and/or a chemical wet etch process. In one example, the etch may include one or more reactive ion etching steps. After etching, the patterned photoresist material can be removed utilizing a stripping process such as, for example, ashing.

Figure 4:
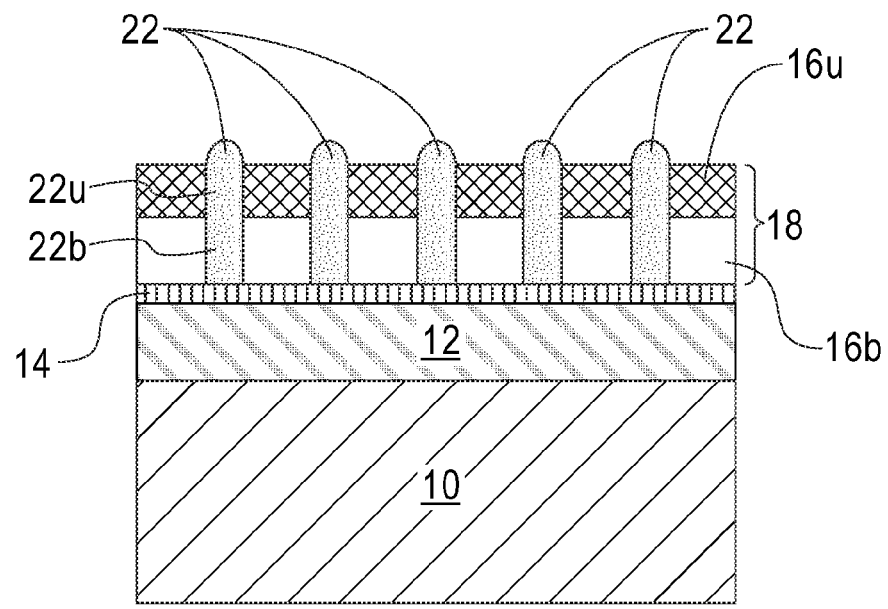
FIG. 4 is a cross sectional view of the first exemplary semiconductor structure of FIG. 3 after selectively growing a semiconductor material within each nano-trench of the plurality of nano-trenches and on exposed portions of the uppermost surface of the semiconductor layer.

Referring now to FIG. 4, there is illustrated the first exemplary semiconductor structure of FIG. 3 after selectively growing a semiconductor material 22 within each nano-trench 20 of the plurality of nano-trenches and on exposed portions of the uppermost surface of the semiconductor layer 14. The semiconductor material 22 that is formed into each of the nano-trenches comprises a different semiconductor material than the semiconductor layer 14. Since the semiconductor material 22 comprises a different semiconductor material than the semiconductor layer 14, a lattice mismatched heterostructure is provided.

In one embodiment of the present application, each semiconductor material 22 that is provided can be a germanium-containing semiconductor material. By "germanium-containing semiconductor material" it is meant any semiconductor material that includes germanium. Examples of germanium-containing semiconductor materials that can be used as the semiconductor material 22 may include pure, i.e., unalloyed, germanium, or a silicon germanium alloy having a germanium content of 20 atomic percent or greater and the remainder being silicon. The silicon germanium alloy may be compositional graded or compositional ungraded.

In another embodiment of the present application, each semiconductor material 22 that is provided can be an III-V compound semiconductor material. By "III-V compound semiconductor material" it is meant any semiconductor material that includes at least one element from Group III (i.e., Group 13 using IUPAC nomenclature) of the Periodic Table of Elements and at least one element from Group V (i.e., Group 15 using IUPAC nomenclature) of the Periodic Table of Elements. Examples of elements from Group III (i.e., Group 13) include, boron, aluminum gallium and indium, while examples of elements from Group V (i.e., Group 15) include nitrogen, phosphorus, arsenic, antimony and bismuth. The range of possible formulae is quite broad because these elements can form binary (two elements, e.g., gallium (III) arsenide (GaAs), indium(III) arsenide (InAs) or indium (III) phosphide (InP)), ternary (three elements, e.g., indium gallium arsenide (InGaAs)) and quaternary (four elements, e.g., aluminum gallium indium phosphide (AlInGaP)) alloy.

In some embodiments (not shown) it is possible to form a first set of semiconductor materials 22 that comprise a Ge-containing material or an III-V semiconductor compound material, and a second set of semiconductor materials 22 that comprise the other of a Ge-containing material or an III-V semiconductor compound material not used in forming the first set of semiconductor materials 22. In such an embodiment, a first mask can be formed prior to the formation of the first set of semiconductor materials 22 on selected areas of the structure shown in FIG. 3. With the first block mask in place, the first set of semiconductor materials 22 can be formed. After forming the first set of semiconductor materials, the first block mask is removed, and then a second block mask is formed in areas of the structure that now include the first set of semiconductor materials 22. With the second block mask in place, the second set of semiconductor materials 22 can be formed. After forming the second set of semiconductor materials, the second block mask is removed.

Each semiconductor material 22 that is formed includes a lower portion 22b having a first defect density and an upper portion 22u having a second defect density that is less than the first defect density. Typically, the upper portion 22u of the semiconductor material is housed within a portion of the nano-trench 20 that is located within the uppermost layer 16u of the bilayered hard mask stack structure 18, while the lower portion 22b of the semiconductor material 22 is housed within a portion of the nano-trench 20 that is located within the bottommost layer 16b of the bilayered hard mask stack structure 18.

In some embodiments of the present application, the selected crystallographic direction of the semiconductor material 22 is aligned with at least one propagation direction of threading dislocations in the nano-trench. Threading dislocations in this region may substantially terminate at the sidewall of the bilayered hard mask stack structure 18 at or below a predetermined distance from the surface of the semiconductor layer 14.

Each semiconductor material 22 that is provided can be formed utilizing an epitaxial semiconductor regrowth process such as is described, for example, in U.S. Patent Application Publication No. 2011/0049569 to Lochtefeld et al., the entire content and disclosure of which is incorporated herein by reference. Notably, and since an epitaxial semiconductor regrowth process is used in forming each semiconductor material 22, each semiconductor material 22 has a same crystalline characteristic as the semiconductor material of the deposition surface. Thus, in the present application, each semiconductor material 22 has an epitaxial relationship, i.e., same crystal orientation, with the underlying semiconductor layer 14.

In one embodiment of the present application, the selected crystallographic direction of the semiconductor layer 14 is aligned with direction of propagation of threading dislocations in each semiconductor material 22. In certain embodiments, the orientation angle ranges from about 30 to about 60 degrees, for example, is about 45 degrees to such crystallographic direction. As mentioned above, the surface of the semiconductor layer may have (100), (110), or (111) crystallographic orientation. In some embodiments, the selected crystallographic direction is substantially aligned with a <110> crystallographic direction of the semiconductor layer 14.

Each semiconductor material 22 can be formed in a nano-trench 20 by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. The reactor chamber is heated, such as, for example, by RF-heating. The growth temperature in the chamber may range from 250° C. to 900° C. depending on the composition of each semiconductor material 22. The growth system also may utilize low-energy plasma to enhance the layer growth kinetics. The epitaxial growth system may be a single-wafer or multiple-wafer batch reactor.

Figure 5:
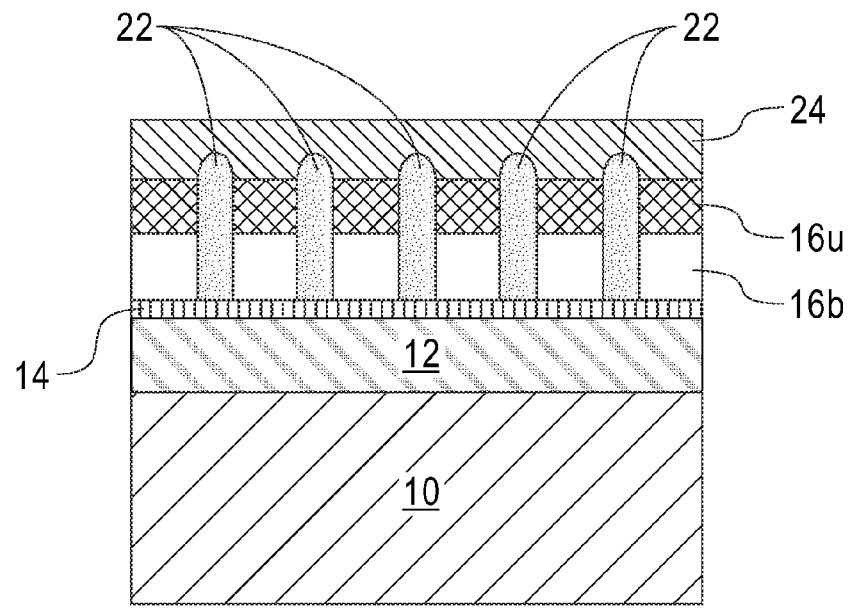
FIG. 5 is a cross sectional view of the first exemplary semiconductor structure of FIG. 4 after forming a protection layer on exposed portions of the uppermost surface of the bilayered hard mask stack structure and on portions of each semiconductor material that extend outside the nano-trenches.

Referring now to FIG. 5, there is illustrated the first exemplary semiconductor structure of FIG. 4 after forming a protection layer 24 on exposed portions of the uppermost surface of the bilayered hard mask stack structure 18 and on portions of the semiconductor material 22 that extend outside each nano-trench 20. The protection layer 24 that is provided is a contiguous layer that is present without any breaks on exposed portions of the uppermost surface of the bilayered hard mask stack structure 18 and on portions of the semiconductor material 22 that extend outside each nano-trench 20.

The protection layer 24 that is employed in the present application comprises a different material than the uppermost layer 16u of the bilayered hard mask stack 16. In one embodiment of the present application, the protection layer 24 may include a dielectric material. Exemplary dielectric materials that can be used as the protection layer 24 include, but are not limited to, an oxide, nitride, and/or oxynitride. In one example, the dielectric material that provides the protection layer 24 can be a high-k material having a dielectric constant greater than silicon dioxide. Exemplary high-k dielectrics that can be used in providing the protection layer 24 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

In another embodiment of the present application, the protection layer 24 may comprise a photoresist material including a positive-tone photoresist composition, a negative-tone photoresist composition or a hybrid photoresist composition.

The protection layer 24 can be formed by any deposition technique including, for example, chemical vapor deposition (CVD), plasma enhanced chemical vapor deposition (PECVD), physical vapor deposition (PVD), sputtering, spin-contacting, evaporation, dip coating or atomic layer deposition (ALD). The protection layer 24 can have a thickness from 10 nm to 100 nm. Other thicknesses that are greater than or lesser than the aforementioned thickness range can also be used for the thickness of the protection layer 24.

Figure 6:
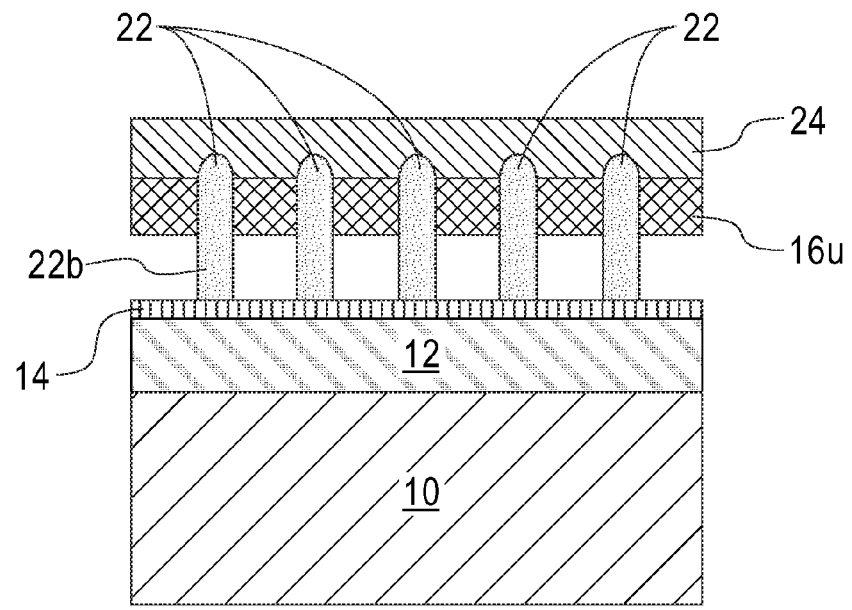
FIG. 6 is a cross sectional view of the first exemplary semiconductor structure of FIG. 5 after removing a bottommost layer of the bilayered hard mask stack structure to expose a lower portion of each semiconductor material and the semiconductor layer.

Referring now to FIG. 6, there is illustrated the first exemplary semiconductor structure of FIG. 5 after removing the bottommost layer 16b of the bilayered hard mask stack structure 18 to expose a lower portion 22b of each semiconductor material 22 and the semiconductor layer 14 of the SOI substrate. The removal of the bottommost layer 16b of the bilayered hard mask stack structure 18 from the first exemplary semiconductor structure shown in FIG. 5 may be performed utilizing a selective etch process. As used herein, the term "selective" in reference to a material removal process denotes that the rate of material removal for a first material is greater than the rate of removal for at least another material of the structure to which the material removal process is being applied. For example and in one embodiment, a selective etch may include an etch chemistry that removes a first material selectively to a second material by a ratio of 10:1 or greater.

In one example, and when the bottommost layer 16b of the bilayered hard mask stack structure 18 is comprised of silicon dioxide, a hydrofluoric acid (HF) wet etch can be used. In another example, and when the bottommost layer 16b of the bilayered hard mask stack structure 18 is comprised of silicon nitride, a hot phosphoric acid wet etch can be used.

As is shown in FIG. 6, the bottommost surface of the lower portion 22b of each semiconductor material 22 remains in contact with a portion of the uppermost surface of the semiconductor layer 14. As is also shown, sidewall portions of each lower portion 22b of each semiconductor material 22 are exposed after the selective etch is performed.

Figure 7:
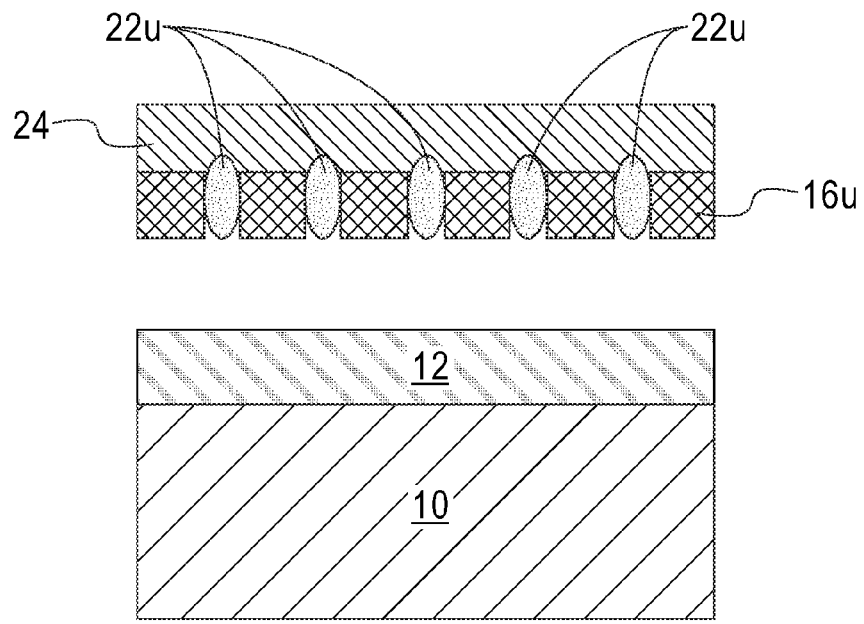
FIG. 7 is a cross sectional view of the first exemplary semiconductor structure of FIG. 6 after performing an etching process which removes the semiconductor layer and the lower portion of each semiconductor material.

Referring now to FIG. 7, there is illustrated the first exemplary semiconductor structure of FIG. 6 after performing an etching process which removes each lower portion 22b of each compound semiconductor material 22 and the semiconductor layer 14 from the structure. After performing the etch, and as is shown in FIG. 7, a remaining upper portion 22u of each semiconductor material 22 is confined within a remaining portion of a corresponding nano-trench 20. Moreover, and after performing the etch, an uppermost surface of the buried insulator layer 12 of the SOI substrate is exposed.

The etching process which removes each lower portion 22b of each semiconductor material 22 and the semiconductor layer 14 from the structure may include any etching process that is selective in removing a semiconductor material. In one embodiment, the etching process which removes each lower portion 22b of each semiconductor material 22 and the semiconductor layer 14 from the structure may be a timed controlled etching process. By "time controlled etching process" it is meant that the selective etch is performed for a predetermined period of time. For example, the timed controlled etching process may be performed for a period of time from 10 seconds to 5 minutes. The etchant used during this step of the present application varies depending on the type of material to be etched. For example, and when silicon germanium is to be etched, HCl can be used as the etchant. In another example, and when germanium is to be etched, hydrogen peroxide can't be used as the etchant.

Figure 8:
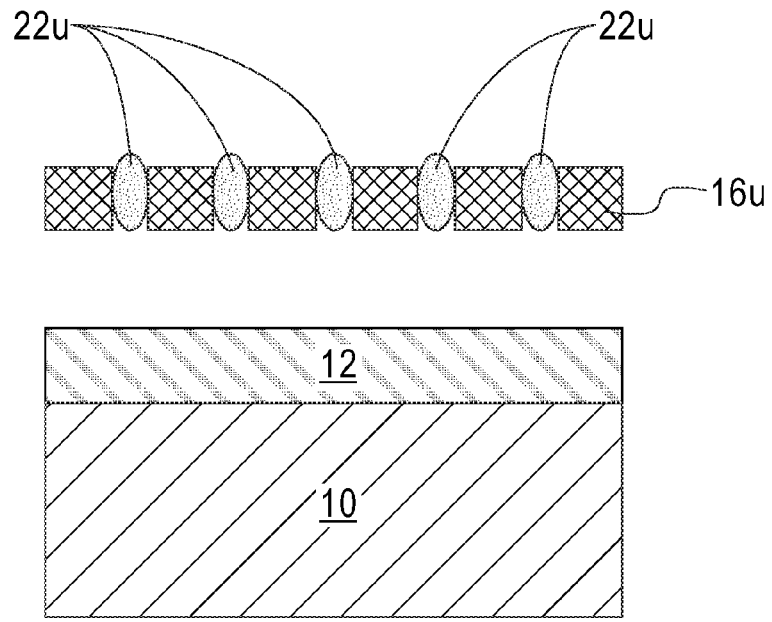
FIG. 8 is a cross sectional view of the first exemplary semiconductor structure of FIG. 7 after removing the protection layer.

Referring now to FIG. 8, there is illustrated the first exemplary semiconductor structure of FIG. 7 after removing the protection layer 24 from the structure. In some embodiments of the present application and when the protection layer 24 is comprised of a dielectric material, an etch can be used to remove the protective layer. In one example, and when a dielectric material is used as the protection layer 24, an anisotropic etch can be used to remove the protection layer 24 from the structure. In another embodiment and when the protection layer 24 comprises a photoresist, the photoresist that provides protection layer 24 can be removed from the structure utilizing a resist stripping process such as, for example, ashing. As is shown, and after the removal of the protection layer from the structure, the upper portion 22u of each semiconductor material 22 remains confined within a remaining portion of a nano-trench 20 that is present in the uppermost layer 16u of the bilayered hard mask stack structure 18.

Figure 9A:
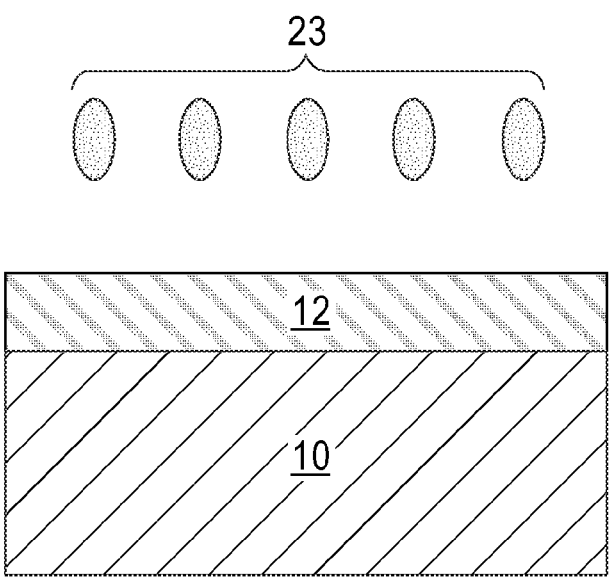
FIG. 9A is a cross sectional view of the first exemplary semiconductor structure of FIG. 8 after removing an uppermost layer of the bilayered hard mask stack structure to expose a plurality of semiconductor nanowires each of which comprises a remaining upper portion of the semiconductor material.
Figure 9B:
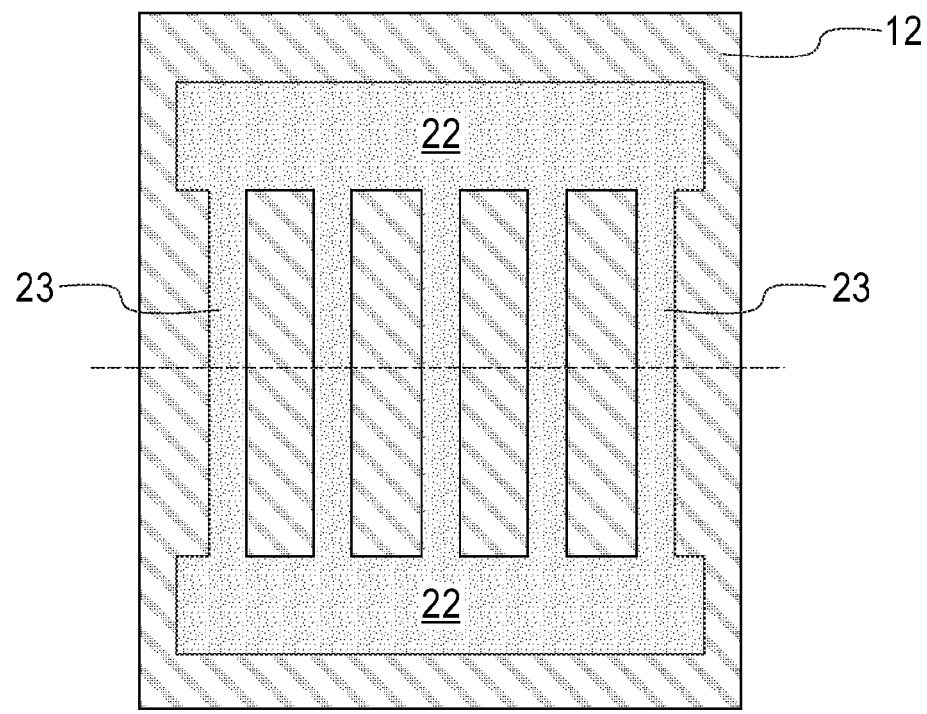
FIG. 9B is a top down view of the first exemplary semiconductor structure of FIG. 9A.

Referring now to FIG. 9A, there is illustrated the first exemplary semiconductor structure of FIG. 8 after removing the uppermost layer 16u of the bilayered hard mask stack structure 18 to entirely expose the upper portion 22u of each semiconductor material 22. Each exposed upper portion 22u provides a semiconductor nanowire 23 that is comprised of germanium-containing semiconductor material (as defined above) or an III-V compound semiconductor (as defined above). In this embodiment of the present application, each semiconductor nanowire 23 has a circular geometry. The semiconductor nanowires 23 that are provided are orientated parallel to each other. As is shown in FIG. 9B, the semiconductor nanowires 23 are anchored to a remaining portion of semiconductor material 22. As such, the semiconductor nanowires 23 are not floating, but instead, they are suspended above the uppermost surface of the buried insulator layer 12.

The uppermost layer 16u of the bilayered hard mask stack structure 18 can be removed utilizing a selective etch. In one example, and when the uppermost 16u of the bilayered hard mask stack structure 18 is comprised of silicon nitride, a hot phosphoric acid wet etch can be used. In another example, and when the uppermost surface layer 16u of the bilayered hard mask stack structure 18 is comprised of silicon dioxide, a hydrofluoric acid (HF) wet etch can be used.

Figure 10:
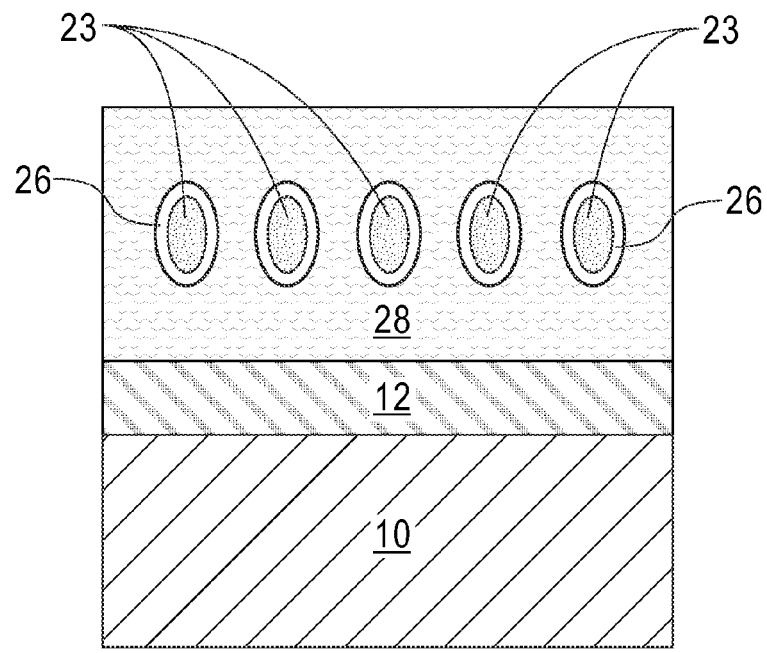
FIG. 10 is a cross sectional view of the first exemplary semiconductor structure of FIG. 9A after forming a gate dielectric material portion surrounding each semiconductor nanowire of the plurality of semiconductor nanowires and forming a gate conductor material.

Referring now to FIG. 10, there is illustrated the first exemplary semiconductor structure of FIG. 9A after forming a gate dielectric material portion 26 surrounding each semiconductor nanowire 23 and forming a gate conductor material 28 on the gate dielectric material portion 26. Collectively, the gate dielectric material portion 26 and the gate conductor material 28 may be referred herein as a gate structure; in the embodiment illustrated each semiconductor nanowire 23 is surrounded by a same gate dielectric material portion 26 and a common gate conductor portion 28. In other embodiments (not shown), block mask technology may be used to form regions that may include a different gate dielectric portion and/or a different gate conductor portion.

The gate structure can be formed utilizing a gate-first or a gate-last process. In a gate first process, the gate structure is formed first followed by the source/drain regions and optionally, merging of each of the source/drain regions.

In a gate last process, the gate structure is formed after source/drain regions are formed. In such a process, a sacrificial gate material is formed straddling each of the semiconductor nanowires and then source regions can be formed into exposed portions of each semiconductor nanowire and on one side of the sacrificial gate structure and then drain regions can be formed in exposed portions of each semiconductor nanowire and on the other side of the gate. An epitaxial growth process can be used to deposit an epitaxial semiconductor material that can merge each of the source/drain regions. Next, the sacrificial gate structure may be replaced with a gate structure as defined above. The gate structure including each gate dielectric material portion 26 and gate conductor material portion 28 may be referred to as a functional gate structure. The term "functional gate structure" is used throughout the present application as a permanent gate structure used to control output current (i.e., flow of carriers in the channel) of a semiconducting device through electrical or magnetic fields.

The gate dielectric material that provides the gate dielectric material portion 26 can be an oxide, nitride, and/or oxynitride. In one example, the gate dielectric material that provides the gate dielectric material portion 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

In some embodiments, some of the semiconductor nanowires may comprise a first gate dielectric material portion, while the other semiconductor nanowires may comprise a second gate dielectric material portion that is different from the first gate dielectric portion.

The gate dielectric material used in providing the gate dielectric material portion 26 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material portion 26. When a different gate dielectric material is used for the gate dielectric material portions, block mask technology can be used. In one embodiment of the present application, the gate dielectric material used in providing the gate dielectric material portion 26 can have a thickness in a range from 1 nm to 10 nm. Other thicknesses that are lesser than or greater than the aforementioned thickness range can also be employed for the gate dielectric material.

The gate conductor portion 28 comprises a gate conductor material. In some embodiments, some of the semiconductor nanowires can include a first gate conductor material, while others may include a second gate conductor material that is different from the first gate conductor material.

The gate conductor material used in providing the gate conductor material portion 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion 28 may comprise an nFET gate metal, while in yet other embodiments, the gate conductor material portion 28 may comprise a pFET gate metal.

The gate conductor material used in providing the gate conductor material portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. The gate conductor material may be patterned after formation thereof. When a different gate conductor material is used for the gate conductor portions, block mask technology can be used. In one embodiment, the gate conductor material used in providing the gate conductor material portion 28 has a thickness from 1 nm to 100 nm. Other thicknesses that are lesser than or greater than the aforementioned thickness range can also be employed for the gate conductor material.

Source/drain regions (not shown) can be formed in portions of each semiconductor nanowire 23 that are not covered by either the gate structure or the sacrificial gate structure. The source/drain regions can be formed by introducing a dopant into the exposed portions of each semiconductor nanowire, which are not covered by either the gate structure or the sacrificial gate structure. The dopant can be n-type or p-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant may be introduced into the exposed portions of each semiconductor nanowire, which are not covered by either the gate structure or the sacrificial gate structure, by ion implantation, plasma doping or gas phase doping. The concentration of dopants used in providing the source/drain regions can range from 5e18 atoms/$cm^3$ to 1.5e21 atoms/$cm^3$.

In some embodiments, the source/drain regions can be merged. The merging of the source/drain regions can be provided by growing an epitaxial semiconductor material utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, each epitaxial semiconductor has an epitaxial relationship, i.e., same crystal orientation, with the underlying semiconductor nanowire 23. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of the epitaxial semiconductor material. In some embodiments, the source gas for the deposition of the epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

A dopant can be introduced into the epitaxial semiconductor material that is used to merge the various regions together either during the epitaxial growth process itself, or following the epitaxial growth process by utilizing gas phase doping. The dopant concentration of each of the merged regions is typically from 5e18 atoms/cm$^3$ to 1.5e21 atoms/cm$^3$.

Figure 11:
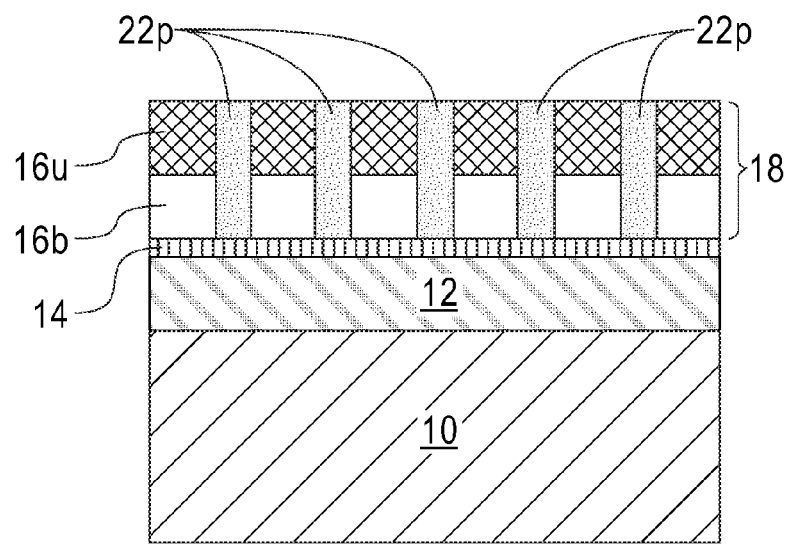
FIG. 11 is a cross sectional view of the first exemplary semiconductor structure of FIG. 4 after performing a planarization process in accordance with another embodiment of the present application.

Referring now to FIG. 11, there is illustrated the first exemplary semiconductor structure of FIG. 4 after performing a planarization process in accordance with another embodiment of the present application. The remaining portion of semiconductor material 22 after the planarization process can be referred to herein as a planarized semiconductor material 22p.

As is shown in FIG. 11, the planarization process removes protruding portions of the upper portion 22u of each semiconductor material 22 and provides a structure in which the remaining portion of the upper portion 22u of each semiconductor material 22 has an uppermost surface that is coplanar with an uppermost surface of the uppermost layer 16u of the bilayered hard mask stack structure 18. The planarization process may include chemical mechanical polishing and/or grinding. At this point of the present application, the planarized semiconductor material 22p has a first height that is equal to the thickness of the bilayered hard mask stack structure 18.

Figure 12:
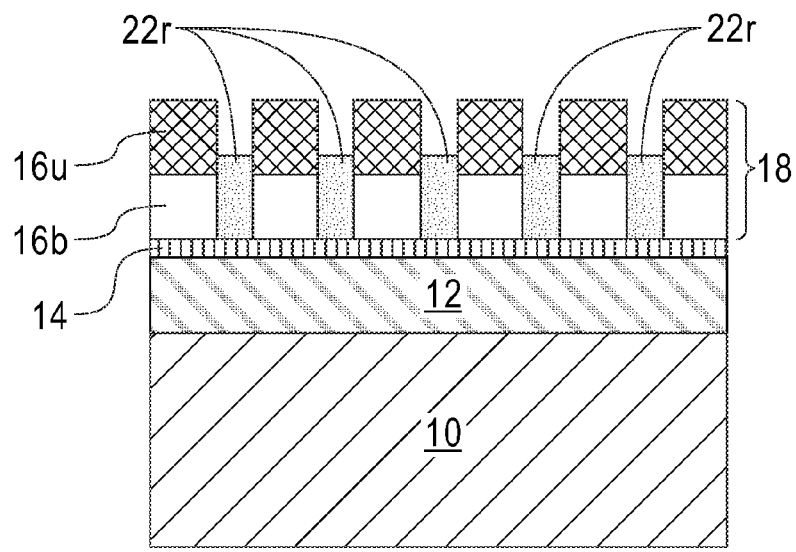
FIG. 12 is a cross sectional view of the first exemplary semiconductor structure of FIG. 11 after performing a reactive ion etch.

Referring now to FIG. 12, there is illustrated the first exemplary semiconductor structure of FIG. 11 after performing a reactive ion etch. This step of the present application removes a remaining upper portion 22u of semiconductor material 22 from within each nano-trench. 20. The remaining portions of the planarized semiconductor material 22p may be referred to herein as a recessed (or reduced height) semiconductor material 22r. The recessed semiconductor material 22r is comprised of the lower portion 22b of the semiconductor material 22. The etch reduces the height of each planarized semiconductor material 22p to a second height that is less than the first height. As shown, the uppermost surface of each recessed semiconductor material 22r is now below the uppermost surface of the bilayered hard mask stack structure 18.

Figure 13:
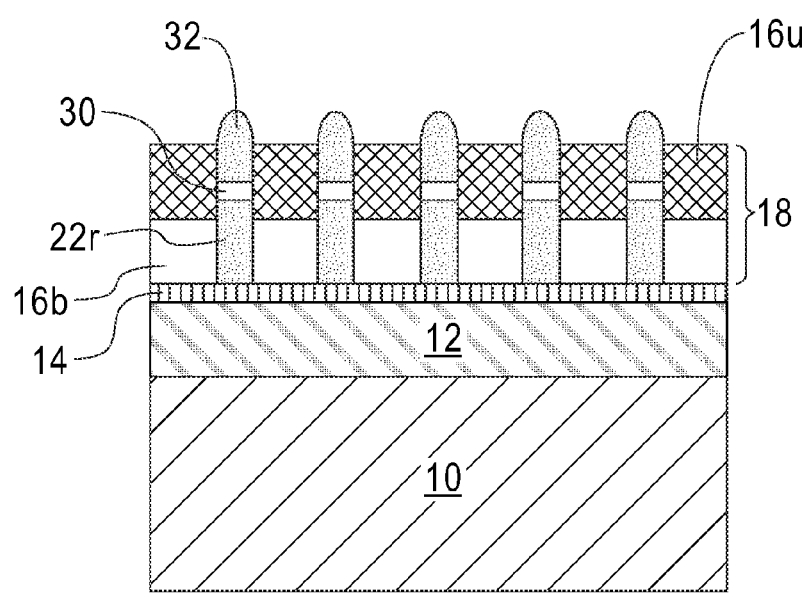
FIG. 13 is a cross sectional view of the first exemplary semiconductor structure of FIG. 12 after forming an etch stop layer on an exposed uppermost surface of each remaining semiconductor material and within each nano-trench and then forming a nanowire precursor semiconductor material on the uppermost surface of the etch stop layer and within each nano-trench.

Referring now to FIG. 13, there is illustrated the first exemplary semiconductor structure of FIG. 12 after forming an etch stop layer 30 on an exposed uppermost surface of each recessed semiconductor material 22r and within each nano-trench 20 and then forming a nanowire precursor semiconductor material 32 on the uppermost surface of the etch stop layer 30. As is shown, a portion of each nanowire precursor semiconductor material 32 remains inside a nano-trench 20, while another portion of each nanowire precursor semiconductor material 32 extends outside of the nano-trench.

The etch stop layer 30 that is provided is comprised of a semiconductor material that is different in terms of composition from the semiconductor material 22. In one embodiment of the present application, the etch stop layer 30 is comprised of strained silicon. The etch stop layer 30 can be formed utilizing an epitaxial growth process as defined above. Since an epitaxial growth process is used, the etch stop layer 30 has an epitaxial relationship with the surface of the recessed semiconductor material 22r from which it is grown from. The thickness of the etch stop layer 30 is typically from 1 nm to 5 nm.

After forming the etch stop layer 30, the nanowire precursor semiconductor material 32 is formed on the surface of the etch stop layer 30 utilizing an epitaxial growth process as defined above. The nanowire precursor semiconductor material 32 comprises a different semiconductor material than the etch stop layer 30. In some embodiments, the nanowire precursor semiconductor material 32 may comprises a same semiconductor material as that of the semiconductor material 22. In one example, the nanowire precursor semiconductor material 32 may comprise a germanium-containing semiconductor material. In yet another example, the nanowire precursor semiconductor material 32 may comprise an III-V compound semiconductor material. In one embodiment of the present application, each nanowire precursor semiconductor material 32 that is formed can have a thickness from 4 nm to 20 nm.

In some embodiments, a vacuum may be broken between the epitaxial growth of the nanowire precursor semiconductor material 32 and the etch stop layer 30. In other embodiments, a vacuum may be maintained between the epitaxial growth of each layer of the nanowire precursor semiconductor material 32 and the etch stop layer 30.

Figure 14:
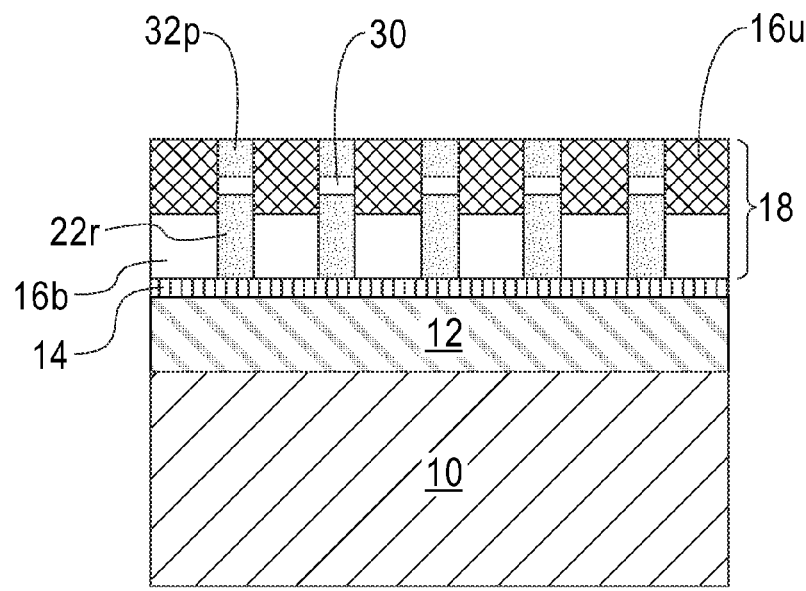
FIG. 14 is a cross sectional view of the first exemplary semiconductor structure of FIG. 13 after performing another planarization process which forms a plurality of planarized semiconductor nanowire template materials, each of which comprises a remaining portion of the nanowire precursor semiconductor material.

Referring now to FIG. 14, there is illustrated the first exemplary semiconductor structure of FIG. 13 after performing another planarization process. The another planarization process removes a protruding portion of each nanowire precursor semiconductor material 32 that is located outside of each nano-trench 20 and provides a planarized semiconductor nanowire template material 32p within each nano-trench 20. The planarized semiconductor nanowire template material 32p has an uppermost surface that is coplanar with an uppermost surface of the bilayered hard mask stack structure 18. The another planarization process may be performed by chemical mechanical planarization and/or grinding.

Figure 15:
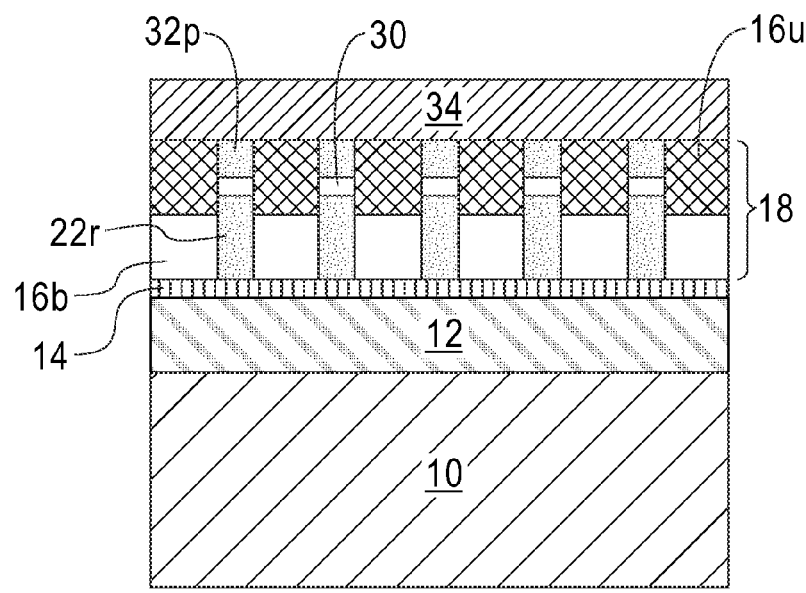
FIG. 15 is a cross sectional view of the first exemplary semiconductor structure of FIG. 14 after forming a protection layer on exposed portions of the uppermost surface of the bilayered hard mask stack structure and on an uppermost surface of each semiconductor nanowire template material.

Referring now to FIG. 15, there is illustrated the first exemplary semiconductor structure of FIG. 14 after forming a protection layer 34 on exposed portions of the uppermost surface of the bilayered hard mask stack structure 18 and on an uppermost surface of the planarized semiconductor nanowire template material 32p. The protection layer 34 that is used in this embodiment of the present application is the same as the protection layer 24 mentioned above.

Figure 16:
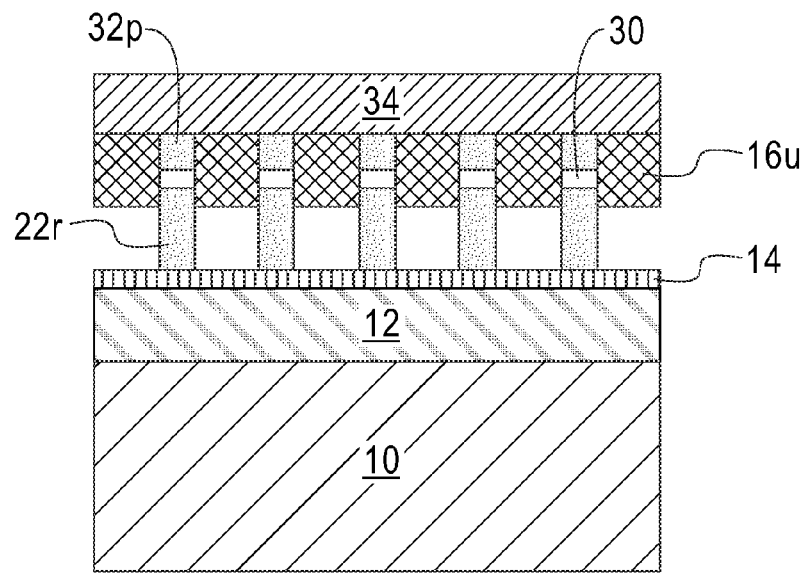
FIG. 16 is a cross sectional view of the first exemplary semiconductor structure of FIG. 15 after removing a bottommost layer of the bilayered hard mask stack structure to expose a lower portion of each semiconductor material and the semiconductor layer.

Referring now to FIG. 16, there is illustrated the first exemplary semiconductor structure of FIG. 15 after removing a bottommost layer 16b of the bilayered hard mask stack structure 18 to expose a lower portion 22b of each semiconductor material 22 and the semiconductor layer 14. The removal of the bottommost layer 16b of the bilayered hard mask stack structure 18 in this embodiment of the present application is the same as that described above in removing the bottommost layer 16b of the bilayered hard mask stack structure 18 from the structure shown in FIG. 5 to provide the structure shown in FIG. 6.

Figure 17:
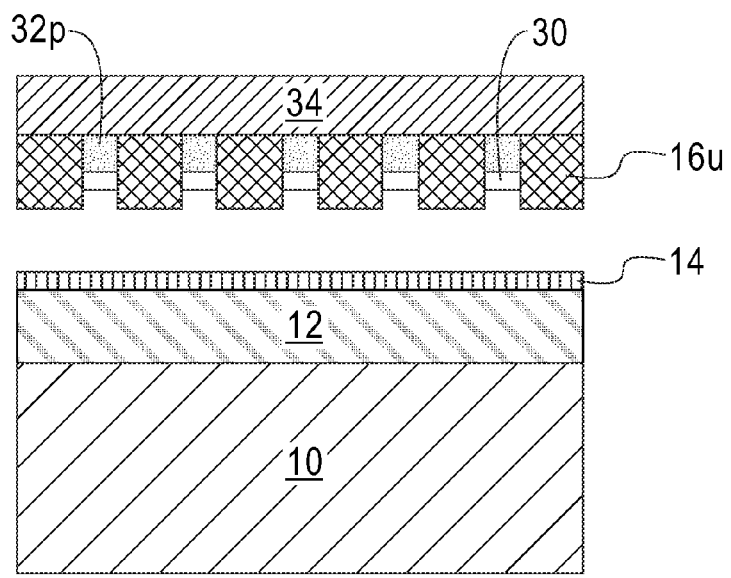
FIG. 17 is a cross sectional view of the first exemplary semiconductor structure of FIG. 16 after performing an etching process which removes the lower portion of each semiconductor material and the semiconductor layer.

Referring now to FIG. 17, there is illustrated the first exemplary semiconductor structure of FIG. 16 after performing an etching process which removes the lower portion 18b of each semiconductor material 22 and the semiconductor layer 14. The etching process that is used in this embodiment of the present application is the same as that used in providing the structure shown in FIG. 7 of the present application. As is shown, the removal of the lower portion 18b of each semiconductor material 22 exposes a surface of etch stop layer 30, while the removal of semiconductor layer 14 exposes the insulator layer 12.

Figure 18:
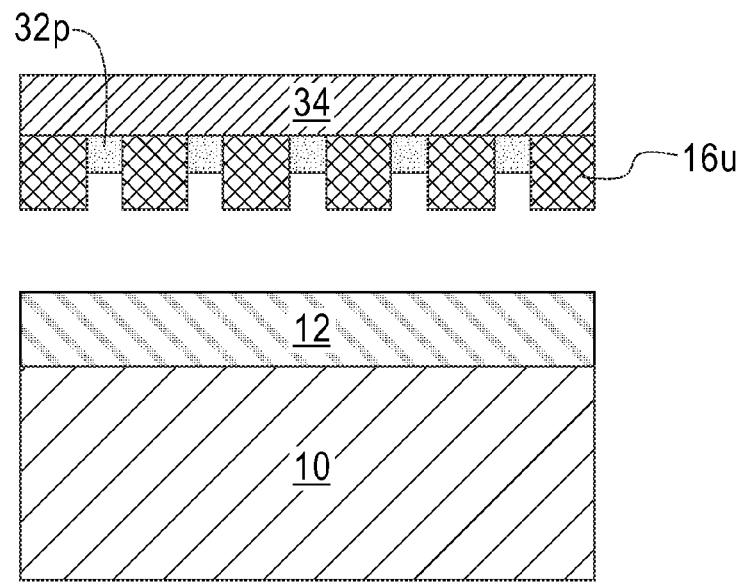
FIG. 18 is a cross sectional view of the first exemplary semiconductor structure of FIG. 17 after removing the etch stop layer and the semiconductor layer.

Referring now to FIG. 18, there is illustrated the first exemplary semiconductor structure of FIG. 17 after removing the etch stop layer 30 and the semiconductor layer 14. In embodiments in which the etch stop layer 30 and the semiconductor layer 14 comprise a same semiconductor material, e.g., silicon, the removal of the etch stop layer 30 and the semiconductor layer 14 may occur utilizing a single etch. In other embodiments in which the etch stop layer 30 and the semiconductor layer 14 comprise a different semiconductor material, the removal of the etch stop layer 30 and the semiconductor layer 14 may occur utilizing two different etching processes.

Figure 19:
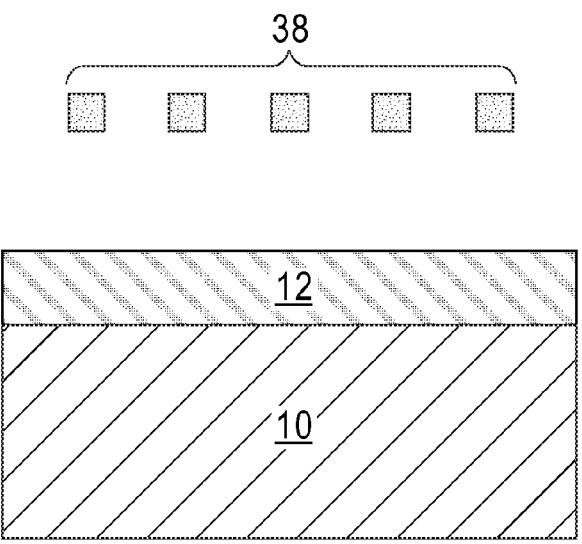
FIG. 19 is cross sectional view of the first exemplary semiconductor structure of FIG. 18 after removing the protection layer and the uppermost layer of the bilayered hard mask stack structure to expose remaining portions of the semiconductor nanowire template material.

Referring now to FIG. 19, there is illustrated the first exemplary semiconductor structure of FIG. 18 after removing the protection layer 36 and the uppermost layer 16u of the bilayered hard mask stack structure 18 to expose remaining portions of the planarized semiconductor nanowire template material 32p. Each exposed remaining portion of the planarized semiconductor nanowire template material 32p is hereinafter referred to as a semiconductor nanowire 38. In this embodiment of the present application, each semiconductor nanowire 38 is six sided and has a parallelepiped geometry.

The protection layer 36 can be removed utilizing the technique mentioned above in removing the protection layer 26 from the structure shown in FIG. 6, while the uppermost layer 16u of the bilayered hard mask stack structure 18 can be removed utilizing one of the techniques mentioned above in providing the structure shown in FIG. 7.

Figure 20:
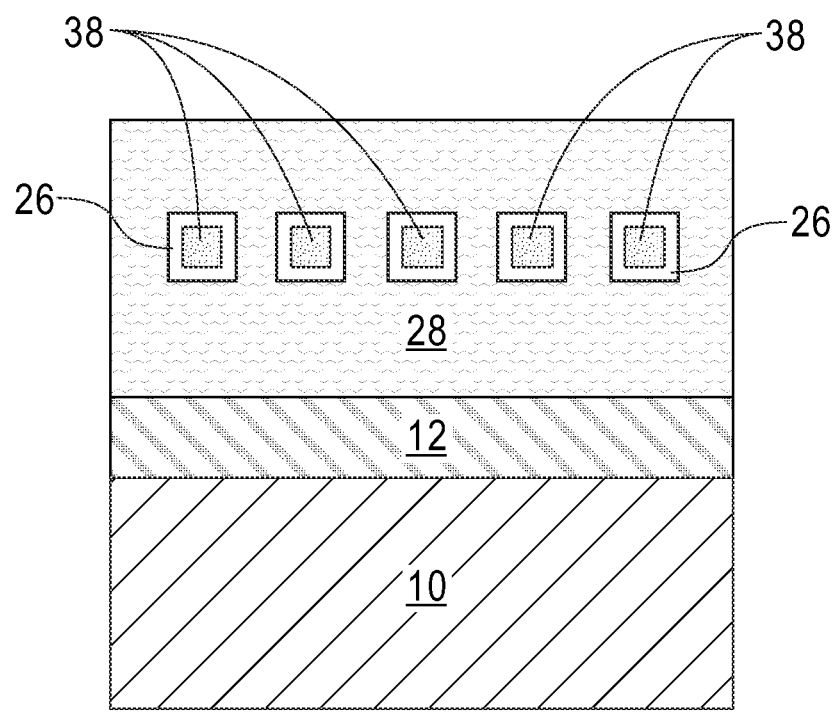
FIG. 20 is a cross sectional view of the first exemplary semiconductor structure of FIG. 19 after forming a gate dielectric material portion surrounding each remaining portion of the semiconductor nanowire template material and forming a gate conductor material.

Referring now to FIG. 20, there is illustrated the first exemplary semiconductor structure of FIG. 19 after forming a gate dielectric material portion 26 surrounding each semiconductor nanowire 38 and forming a gate conductor material 28. The gate dielectric material portion 26 and the gate conductor material 28 used in this embodiment of the present application are the same as those mentioned above. Also, the gate dielectric material portion 26 and the gate conductor material 28 used in this embodiment of the present application can be formed utilizing the same techniques as mentioned above in providing the structure shown in FIG. 10 of the present application.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a gate-all-around transistor comprising:

providing a bilayered hard mask stack structure on an uppermost surface of a semiconductor layer, wherein said bilayered hard mask stack structure includes at least one nano-trench extending to a portion of said uppermost surface of said semiconductor layer;

epitaxially growing a semiconductor material within said at least one nano-trench and on said portion of said uppermost surface of said semiconductor layer, wherein said semiconductor material comprises a different semiconductor than said semiconductor layer and has a lower portion of a first defect density and an upper portion having a second defect density that is less than the first defect density;

removing a bottommost layer of said bilayered hard mask stack structure to expose said lower portion of said semiconductor material;

etching said lower portion of said semiconductor material and said semiconductor layer, wherein said etching said semiconductor layer exposes an insulator layer that is located beneath said semiconductor layer;

removing an uppermost layer of said bilayered hard mask stack structure to expose said upper portion of said semiconductor material; and forming a gate structure surrounding said upper portion of said semiconductor material.

2. The method of claim 1, wherein said semiconductor material is selected from at least one of a Ge-containing semiconductor material and an III-V compound semiconductor material.

3. The method of claim 1, further comprising forming a protection layer on said semiconductor material prior to said removing said bottommost layer of said bilayered hard mask stack structure.

4. The method of claim 1, wherein said removing said bottommost layer of said bilayered hard mask stack structure comprises a selective etching process.

5. The method of claim 1, wherein said etching said lower portion of said semiconductor material and said semiconductor layer comprises a timed controlled etching process.

6. The method of claim 1, wherein said removing said uppermost layer of said bilayered hard mask stack structure comprises a selective etching process.

7. The method of claim 1, wherein said forming said gate structure comprising:
forming a gate dielectric material portion around said upper portion of said semiconductor material; and
forming a gate electrode portion around said dielectric material portion.

8. The method of claim 1, wherein said epitaxially growing said semiconductor material comprises atmospheric-pressure CVD (APCVD), low- (or reduced-) pressure CVD (LPCVD), ultra-high-vacuum CVD (UHVCVD), molecular beam epitaxy (MBE), metal-organic CVD (MOCVD) or atomic layer deposition (ALD).

9. The method of claim 8, wherein said epitaxially growing said semiconductor material is performed at a growth temperature from 250° C. to 900° C.

10. The method of claim 1, wherein said upper portion of said semiconductor material that is exposed has a circular geometry.

11. A method of forming a gate-all-around transistor comprising:
providing a bilayered hard mask stack structure on an uppermost surface of a semiconductor layer, wherein said bilayered hard mask stack structure includes at least one nano-trench extending to a portion of said uppermost surface of said semiconductor layer;
epitaxially growing a semiconductor material within said at least one nano-trench and on said portion of said uppermost surface of said semiconductor layer, wherein said semiconductor material comprises a different semiconductor than said semiconductor layer and has a lower portion of a first defect density and an upper portion having a second defect density that is less than the first defect density;
removing said upper portion of said semiconductor material to provide a recessed semiconductor material within said at least one nano-trench;
forming an etch stop layer, and a semiconductor nanowire template material on each recessed semiconductor material, wherein said semiconductor nanowire template material has an uppermost surface that is coplanar with an uppermost surface of said bilayered hard mask stack structure;
removing a bottommost layer of said bilayered hard mask stack structure to expose said lower portion of said semiconductor material;
etching said lower portion of said semiconductor material and said semiconductor layer, wherein said etching of said semiconductor layer exposes an insulator layer that is located beneath said semiconductor layer and said etching of said lower portion of said semiconductor material exposes a bottommost surface of said etch stop layer;
removing said etch stop layer and an uppermost layer of said bilayered hard mask stack structure to expose said semiconductor nanowire template material; and
forming a gate structure surrounding said semiconductor nanowire template material.

12. The method of claim 11, wherein said semiconductor material is selected from at least one of a Ge-containing semiconductor material and an III-V compound semiconductor material.

13. The method of claim 11, wherein said removing said upper portion of said semiconductor material to provide a recessed semiconductor material within said at least one nano-trench comprises:
planarizing a protruding portion of said upper portion of said semiconductor material to provide a planarized semiconductor material portion in said at least one nano-trench, wherein said planarized semiconductor material portion has an uppermost surface that is coplanar with an uppermost surface of said bilayered hard mask stack structure; and
recessing said planarized semiconductor material portion below said uppermost surface of bilayered hard mask stack structure.

14. The method of claim 11, wherein said forming said etch stop layer comprises epitaxially growing another semiconductor material that is different from said previously epitaxially grown semiconductor material.

15. The method of claim 14, wherein said forming said semiconductor nanowire template material comprises:
epitaxially growing a yet other semiconductor material that is different from said etch stop layer; and
planarizing said yet other semiconductor material.

16. The method of claim 15, wherein said etch stop layer comprises strained silicon, and said semiconductor nanowire template material is selected from a Ge-containing semiconductor material and an III-V compound semiconductor material.

17. The method of claim 11, further comprising forming a protection layer on said semiconductor material prior to said removing said bottommost layer of said bilayered hard mask stack structure.

18. The method of claim 11, wherein said epitaxially growing said semiconductor material comprises atmospheric-pressure CVD (APCVD), low- (or reduced-) pressure CVD (LPCVD), ultra-high-vacuum CVD (UHVCVD), molecular beam epitaxy (MBE), metal-organic CVD (MOCVD) or atomic layer deposition (ALD).

19. The method of claim 18, wherein said epitaxially growing said semiconductor material is performed at a growth temperature from 250° C. to 900° C.

20. The method of claim 11, wherein said semiconductor nanowire template material that is exposed is six-sided and has a parallelepiped geometry.

* * * * *